(12) United States Patent
Tsui

(10) Patent No.: US 7,517,759 B2
(45) Date of Patent: Apr. 14, 2009

(54) METHOD OF FABRICATING METAL OXIDE SEMICONDUCTOR DEVICE

(75) Inventor: Bing-Yue Tsui, Hsinchu (TW)

(73) Assignee: Episil Technologies Inc., Hsinchu (TW)

( * ) Notice: Subject to any disclaimer, the term of this patent is extended or adjusted under 35 U.S.C. 154(b) by 73 days.

(21) Appl. No.: 11/861,062

(22) Filed: Sep. 25, 2007

(65) Prior Publication Data

US 2008/0009118 A1   Jan. 10, 2008

Related U.S. Application Data

(62) Division of application No. 10/941,276, filed on Sep. 14, 2004, now Pat. No. 7,294,550.

(30) Foreign Application Priority Data

Dec. 18, 2003   (TW) .............................. 92135905 A

(51) Int. Cl.
   *H01L 21/336* (2006.01)
(52) U.S. Cl. .................. 438/270; 438/197; 257/E29.26
(58) Field of Classification Search ................ 438/270, 438/197
   See application file for complete search history.

(56) References Cited

U.S. PATENT DOCUMENTS

| | | | | |
|---|---|---|---|---|
| 5,532,179 A | * | 7/1996 | Chang et al. | 438/270 |
| 5,814,858 A | * | 9/1998 | Williams | 257/328 |
| 6,535,828 B1 | * | 3/2003 | Furukawa et al. | 702/56 |
| 7,161,208 B2 | * | 1/2007 | Spring et al. | 257/328 |
| 2005/0167695 A1 | * | 8/2005 | Yilmaz | 257/134 |
| 2007/0063272 A1 | * | 3/2007 | Arena et al. | 257/330 |

* cited by examiner

*Primary Examiner*—Thanh Nguyen
(74) *Attorney, Agent, or Firm*—J.C. Patents

(57) ABSTRACT

A method of fabricating an MOS device is described. A substrate doped a first type dopant is provided as a drain. A first type epitaxial layer is formed on the substrate and is patterned with a trench to form several islands. A gate dielectric layer is then formed on the surface of the trench, and a gate is formed in the trench covering the gate dielectric layer. A second type dopant is doped into the islands with the doping concentration decreasing gradually from the bottom to the top of the islands. Afterwards, a source is formed at the top of the islands. Accordingly, the doping concentration in the islands decreases gradually from the drain to the source with the highest doping concentration near the drain. Therefore, the width of the depletion region can be reduced, and the length of the device channel can be reduced for lowering channel resistance and gate capacitance.

5 Claims, 7 Drawing Sheets

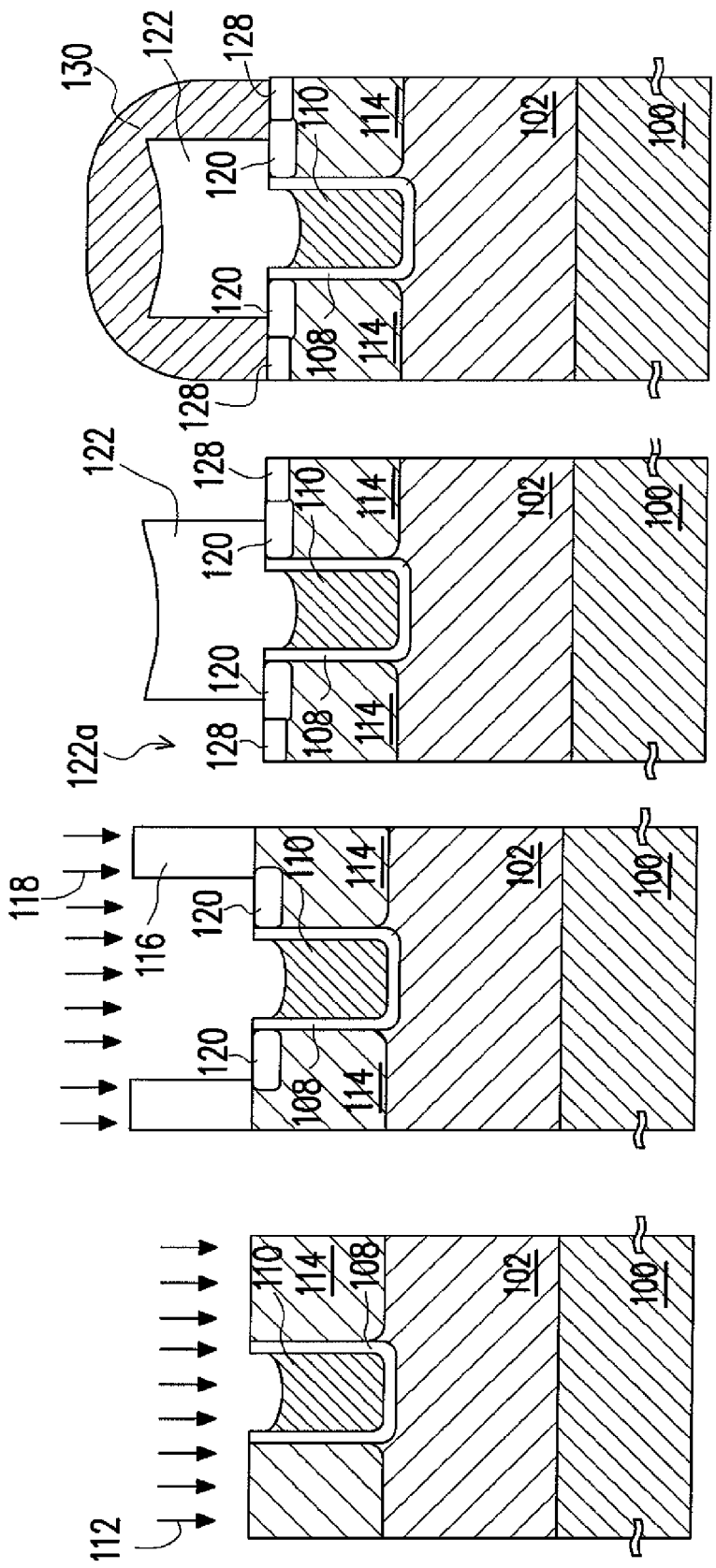

METHOD OF FABRICATING METAL OXIDE SEMICONDUCTOR DEVICE

CROSS-REFERENCE TO RELATED APPLICATION

This application is a divisional application of, and claims the priority benefit of, U.S. application Ser. No 10/941,276 filed on Sep. 14, 2004, now U.S. Pat. No. 7,294,550 which claims the priority benefit of Taiwan application serial no. 92135905, filed on Dec. 18, 2003.

BACKGROUND OF THE INVENTION

1. Field of the Invention

The present invention relates to a metal oxide semiconductor (MOS) device and fabricating method thereof, and particularly to a power MOS field effect transistor (Power MOSFET) and fabricating method thereof.

2. Description of the Related Art

A conventional Power MOSFET is usually designed as a vertical transistor, wherein a drain is formed on the back face of a wafer, and a source and a gate of transistors are formed on the front face of the wafer. Hence, the drains of the transistors are connected in parallel so as to endure considerably large driving-current.

Based on a conventional method of fabricating Power MOSFET, a substrate doped by n-type dopant is first provided to be used as a drain. An epitaxial layer is formed on the substrate, and then the epitaxial layer is patterned to form trenches and islands. Next, a gate oxide layer and a gate are formed in the trench, and a doping layer is formed on the surface of the islands. Ions in the doping layer are diffused to the islands via a thermal drive-in mechanism so that the p-type dopant is doped in the islands and consequently a source is formed at the top of the islands.

FIG. 1 shows doping concentration in a device of a conventional Power MOSFET. The vertical coordinate axis indicates concentration and the horizontal coordinate axis indicates depth. A drain (n-type) is located on the bottom, and a source (n-type) is located at the top of the device. The doping concentration between the source, the islands (p-type) and the drain decreases gradually in the direction from the source to the drain, and the highest concentration is located near the source. This is because that the p-type ions are doped in the islands conventionally via a thermal drive-in mechanism, so that the ion concentration is higher near the source (i.e., the top of the islands).

Therefore, there exists a problem in such a concentration distribution in the islands of the devices. During the operation of the devices, a high voltage is applied on the drain, depletion will develop gradually in the direction from the drain towards the source, and consequently depletion region will be generated between the drain and the source. The width of the depletion region increases with the drop in doping concentration in the depletion region. If the depletion region becomes too wide, a punch through will occur between the source and the drain. As shown in FIG. 1, however, the ion concentration in islands of conventional devices decreases in the direction from the source to the drain, and the highest concentration is near the source. In the region near the drain, the concentration is low and thus a large depletion region will be formed. For increasing punch through voltage of the devices, it requires to increase the distance (channel length) between the source and the drain, which will increase the depth of the trench and consequently increase the channel resistance.

Moreover, the threshold voltage of a device of conventional Power MOSFET depends on the highest concentration of doping concentration in the islands. On one hand, the doping concentration near the drain can be increased through the increase of the doping concentration in the islands, which may prevent the depletion region from becoming too wide, but will cause the increase of the threshold voltage of the device, reduce the driving current of the device, and consequently decrease the mobility of the carriers and increase the channel resistance. On the other hand, the doping concentration near the source can be lowered through decreasing the doping concentration in the islands, but which will cause the drop of the threshold voltage of the device, further decrease the doping concentration near the drain, and consequently enlarge the depletion region. Therefore, the doping concentration in the islands of a conventional device affects the threshold voltage of the device, and the magnitude of the threshold voltage will affect the doping concentration near the source and the drain and further affect the channel length or the channel resistance.

SUMMARY OF THE INVENTION

In view of the above, it is an object of the present invention to provide an MOS device and fabricating method thereof so as to avoid problems of the increase of channel resistance caused by punch through between the source and the drain of the device.

It is another object of the present invention to provide an MOS device and fabricating method thereof so as to avoid the impedimentary effects between the threshold voltage of the device and the concentration in the islands near the source or near the drain.

To achieve the above and other objectives, the invention provides a method of fabricating an MOS device, wherein a substrate doped a first type dopant is first provided as a drain of the device. Next, a first type epitaxial layer is formed on the substrate. The epitaxial layer is patterned with a pattern of trenches to form a plurality of islands. A gate dielectric layer is then formed on the surface of the trench, and a gate is subsequently formed in the trench to cover the gate dielectric layer. A second type dopant is doped in the islands, wherein the doping concentration of the second type dopant in the islands decreases gradually from the bottom to the top of the islands. In one preferred embodiment of the invention, a second type dopant is doped in the islands by a process of, for example, high-energy ion implantation. A source is subsequently formed at the top of the island.

This invention also provides a method of fabricating an MOS device, wherein a substrate doped a first type dopant is first provided as a drain of the device. Next, a first type epitaxial layer is formed on the substrate, and a second type epitaxial layer is formed on the first type epitaxial layer, wherein the doping concentration in the second type epitaxial layer decreases gradually from the bottom to the top thereof. The second type epitaxial layer as well as a portion of the first type epitaxial layer is then patterned with a pattern of trenches to form a plurality of islands. A gate dielectric layer is then formed on the surface of the trench, and a gate is subsequently formed in the trench to cover the gate dielectric layer. A source is subsequently formed at the top of the island.

The present invention further provides an MOS device which comprises a first type substrate, a first type epitaxial layer, a plurality of second type islands, a gate, a gate dielectric layer and a source. Wherein, the first type substrate is used as a drain. The first epitaxial layer is formed on the first type substrate, and a plurality of the second type islands are formed on the first epitaxial layer, wherein the doping concentration in the second type islands decreases gradually in the direction from the bottom to the top of the second type islands. Besides, the gate is formed between the second type islands. The gate dielectric layer is formed between the gate and the second type islands as well as the first epitaxial layer. The source is formed at the top of the second type island.

In a devices of the present invention, the doping concentration in the islands decreases gradually from the drain to the source. Thus, the width of the depletion region can be reduced when the device operates, and the length of the device channel can be reduced for lowering the channel resistance and the gate capacitance.

Furthermore, in a devices of the present invention, the highest doping concentration in the islands is located not near the source but rather near the drain, the value of the highest doping concentration in the islands depends on the dosage of the ion implantation or the amount of dopants during the formation of the epitaxial layer, and thus the threshold voltage of the device will not affect the doping concentration near the source and the drain.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 2A to 2G are schematic cross-sectional views illustrating a process of fabricating a MOS device according to one preferred embodiment of the present invention.

DESCRIPTION OF THE PREFERRED EMBODIMENTS

Figure 1:
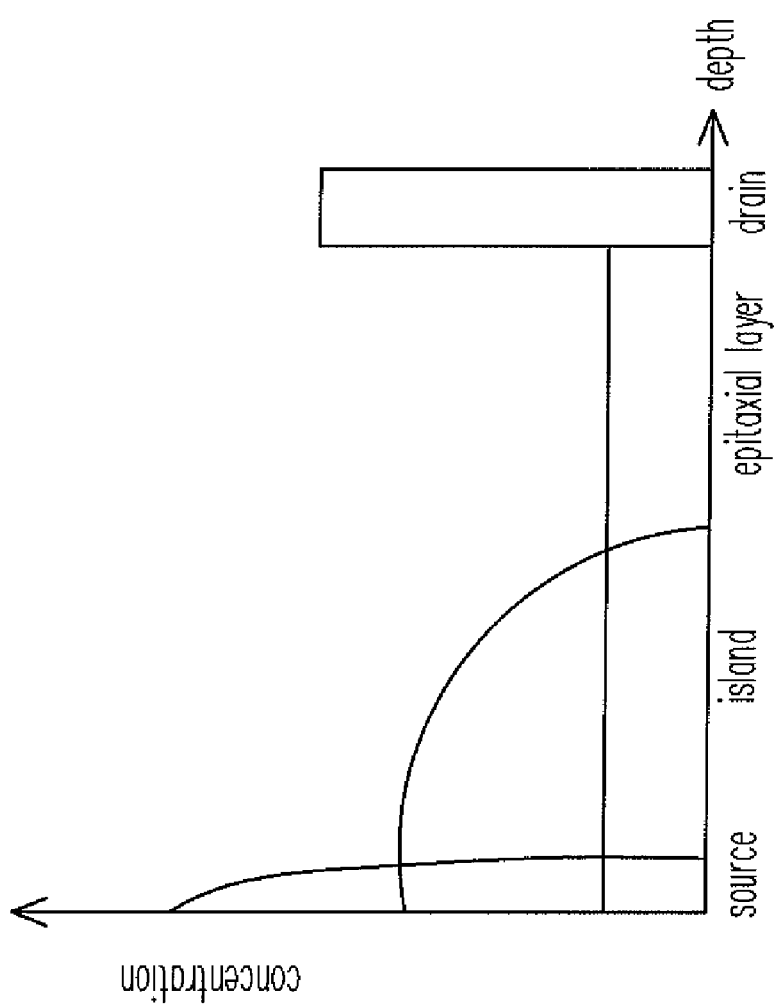
FIG. 1 is a graph showing distribution of doping concentration in a conventional MOS device.

Reference will now be made in detail to the preferred embodiments of the invention, examples of which are illustrated in the accompanying drawings. Wherever possible, the same reference numbers are used in the drawings and the description to refer the same or like parts.

Figure 2C:
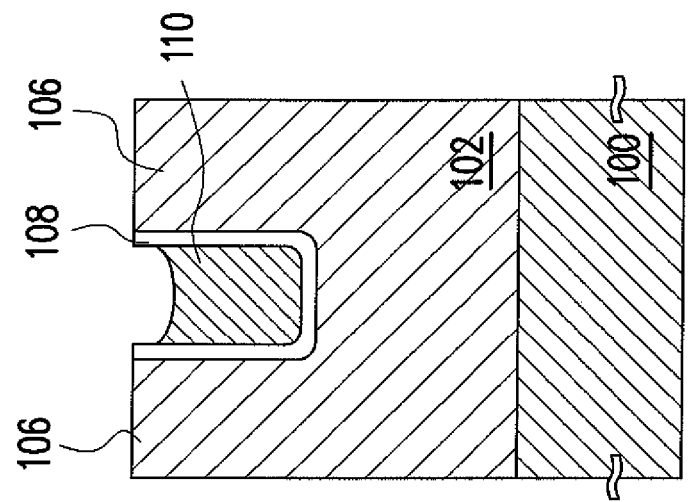
Figure 2B:
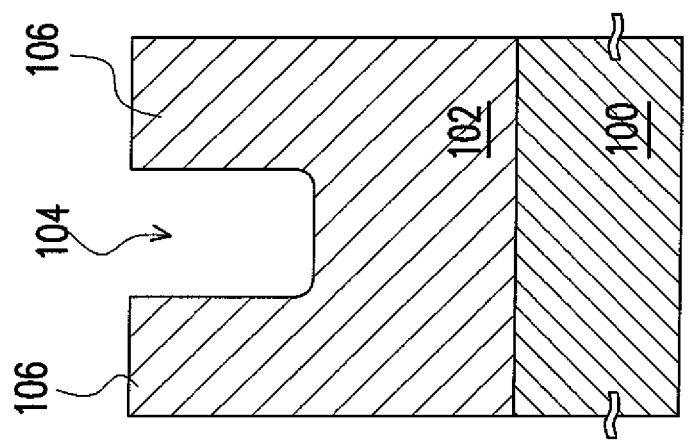
Figure 2A:
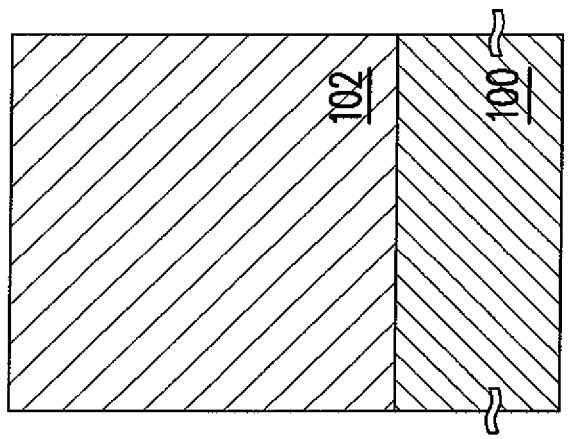

FIGS. 2A to 2G are schematic cross-sectional views illustrating a process of fabricating a MOS device according to one preferred embodiment of the present invention. As shown in FIG. 2A, a first type substrate 100, for example, a silicon substrate doped an n-type dopant, is provided as a drain of a MOS device. An epitaxial layer 102 is than formed on the substrate 100. The first type dopant, for example, an n-type dopant, is also doped in the epitaxial layer 102, and the doping concentration in the epitaxial layer 102 is lower than that in the substrate 100 (i.e., the drain).

Figure 4:
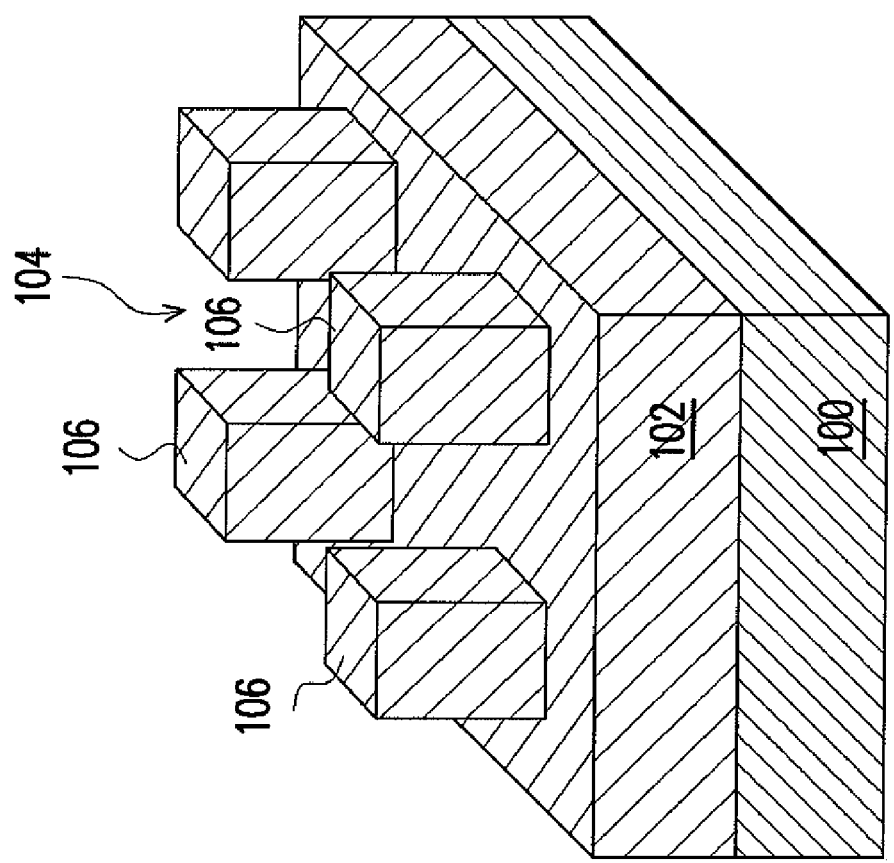
FIG. 4 is a perspective view of the structure shown in FIG. 2B.

Referring to FIG. 2B, the epitaxial layer 102 is patterned with a pattern of the trench 104 to form a plurality of islands 106, which is shown perspectively in FIG. 4. In one preferred embodiment of the invention, the epitaxial layer 102 is patterned via, for example, a photolithographic and an etching process, while the depth of the trench 104 is, for example, between 0.7 and 1.8 μm.

Referring to FIG. 2C, on the surface of the trench 104, a gate dielectric layer 108 is formed via, for example, a thermal oxidation process, and a gate 110 is subsequently formed in the trench 104 to cover the gate dielectric layer 108. In one of preferred embodiment of the invention, the process to form the gate 110 is, for example, depositing a poly-silicon layer (not shown) on the epitaxial layer 102, filing the trench 104 and covering the islands 106, and then performing an etching process or a chemical mechanical grinding process until the surface of the trench 106 is exposed so that the upper surface of the poly-silicon layer in the trench 104 is slightly lower than the upper surface of the islands 106.

Referring to FIG. 2D, a second type dopant is doped in the islands 106 to convert the islands 106 to a second type islands 114, wherein the doping concentration of the second type dopant in the second type islands 114 decreases gradually from the bottom to the top of the second type islands 114. In one preferred embodiment of the invention, a second type dopant is doped in the islands 106 to form a second type islands 114 by a process of, for example, high-energy ion implantation 112, wherein the energy used in the ion implantation step is, for example, between 80 and 320 KeV, the implanted ion is, for example, boron or other p-type ion. Note that the level of energy used in the ion implantation step is set based on the depth of the preformed trench 104, so that the gate 110 can be formed between the second type islands 114, and moreover, partially in the first type epitaxial layer 102.

Referring to FIG. 2E, a photoresist layer 116 is formed on the epitaxial layer 102 exposing a region predefined on the second type islands 114 to form a source. An ion implantation step 118 is then preformed using the photoresist layer 116 as a mask to form a source 120, wherein the source 120 is the same type as the dopant, for example, an n-type dopant, doped in the drain (i.e., the substrate 100). The photoresist layer 116 is later removed. Thus, a MOS transistor is formed.

In the MOS transistors of the present invention, the doping concentration of the second type dopant doped in the islands 114 decreases gradually from the bottom to the top of the islands 114. In other words, the doping concentration in the islands 114 decreases gradually from the drain (i.e., the substrate 100) towards the source 120, while the highest doping concentration in the islands 114 is located near the drain (i.e., the substrate 100) rather than near the source like in conventional devices.

Next, a process to form an interconnect metal is performed as shown in FIG. F. A dielectric layer 122 is formed on the device, and a contact opening 122a is formed in the dielectric layer 122 to expose a portion of the second type islands 114 and a portion of the source 120. A second type doping region 128 is than formed in the exposed region on the contact opening 122a, while the doping concentration of the second type doping region 128 is higher than that in the second type islands 114 but lower than that in the source 120, so that the subsequently formed contact window will have better electric contacting characteristics. Further, referring to FIG. 2G, an interconnect metal 130 is formed on the dielectric layer 122 and in the contact opening 122a.

In addition to the foregoing methods to form MOS devices having islands with special doping concentration, the present invention provides other methods to form such MOS devices, as described in the following.

Figure 3C:
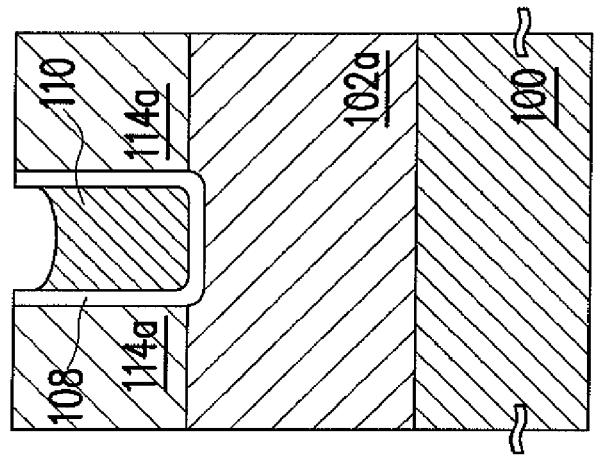
FIGS. 3A to 3D are schematic cross-sectional views illustrating a process of fabricating a MOS device according to another preferred embodiment of the present invention.
Figure 3B:
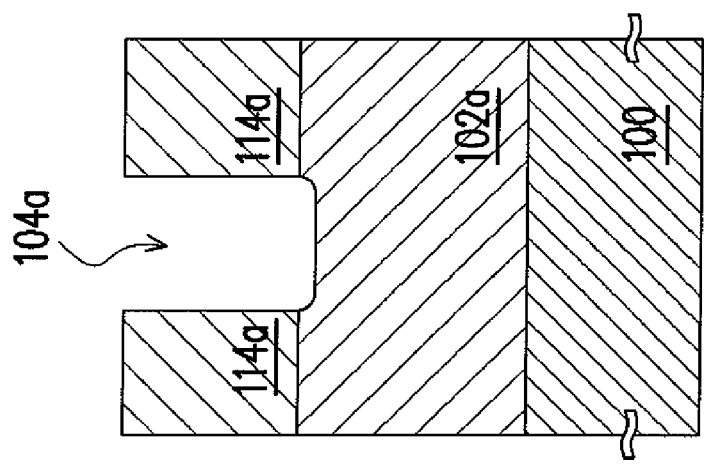
Figure 3A:
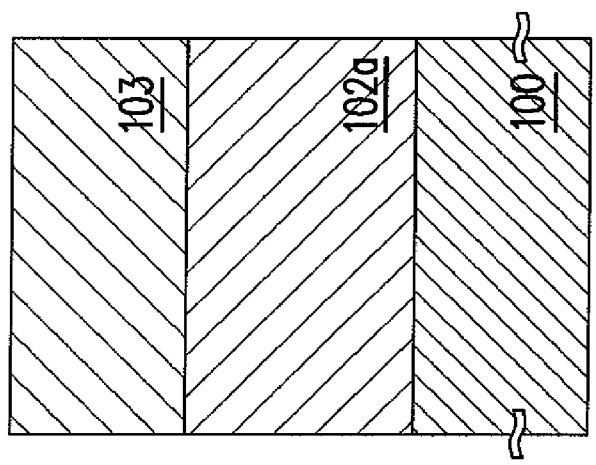

Referring to FIG. 3A, a first type substrate 100 is provided. The substrate 100 is, for example, a silicon substrate doped an n-type dopant, wherein the substrate 100 doped a first type dopant can be also used as a drain for a MOS transistor. Next, a first epitaxial layer 102a is formed on the substrate 100, wherein the first type epitaxial layer 102a is doped an n-type dopant, and the doping concentration is lower than that in the substrate 100 (i.e., the drain). Further, a second type epitaxial layer 103 is formed on the first type epitaxial layer 102a, wherein the doping concentration in the second type epitaxial layer 103 decreases gradually from the bottom to the top of the second type epitaxial layer 103. During such a process to grow the second type epitaxial layer 103, doping concentration can be adjusted by introducing a p-type dopant so as to achieve the doping concentration in the second type epitaxial layer 103 decreasing from the bottom to the top of the second type epitaxial layer 103.

Referring to FIG. 3B, the second type epitaxial layer 103 and a portion of the first type epitaxial layer 102a are patterned via a photolithographic and etching process to form a pattern of trench 104a and a plurality of islands 104a doped the second type dopant. Next, as shown in FIG. 3C, a gate dielectric layer 108 is formed on the surface of the trench 104a, and a gate 110 is formed on the dielectric layer 108.

Figure 3D:
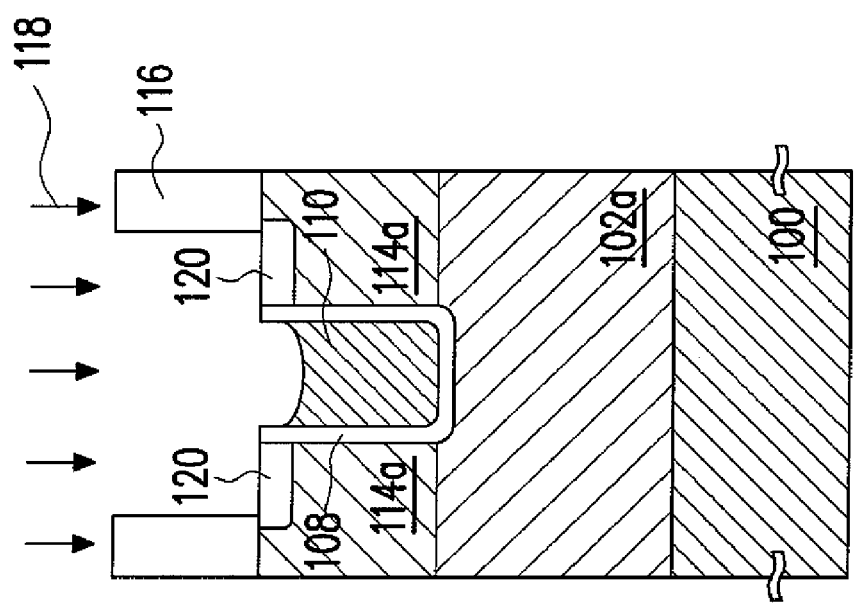

Referring to FIG. 3D, a photoresist layer 116 is formed to expose a predefined region to form a source on the second type islands. An ion implantation step 118 is then performed using the photoresist layer 116 as mask so that a source 120 is formed, wherein the source 120 is the same type, for example, n-type, as that of the dopant doped in the drain (i.e., the substrate 100). Next, the photoresist layer 116 is removed. An MOS transistor is thus formed. The subsequent steps to form interconnect metal are identical as mentioned above, and thus the detailed description is omitted here.

The MOS devices formed via the above two methods comprise a first type substrate 100, a first type epitaxial layer 102 (or 102a), a plurality of second type islands 114 (or 114a), a gate 110, a dielectric layer 108 and a source 120. Wherein, the first type substrate 100 is used as a drain. The first type epitaxial layer 102 is formed on the first type substrate 100, and the plurality of the islands 114 (or 114a) are formed on the first type epitaxial layer 102 (or 102a), wherein the doping concentration in the second type islands 114 (or 114a) decreases gradually from the bottom to the top of the second type islands 114 (or 114a). In addition, the gate 110 is formed between the second type islands 114 (of 114a) and partially in the first type epitaxial layer 102 (or 102a), while the gate 110 has a depth of, for example, between 0.7 and 1.8 μm. The dielectric layer 108 is formed between the gate 110 and the second type islands 114 (or 114a) as well as the first type epitaxial layer 102 (or 102a). The source 120 is formed at the top of the second type islands 114 (or 114a), wherein the doping concentration in the source and the drain is higher than that in the first type epitaxial layer.

Figure 5:
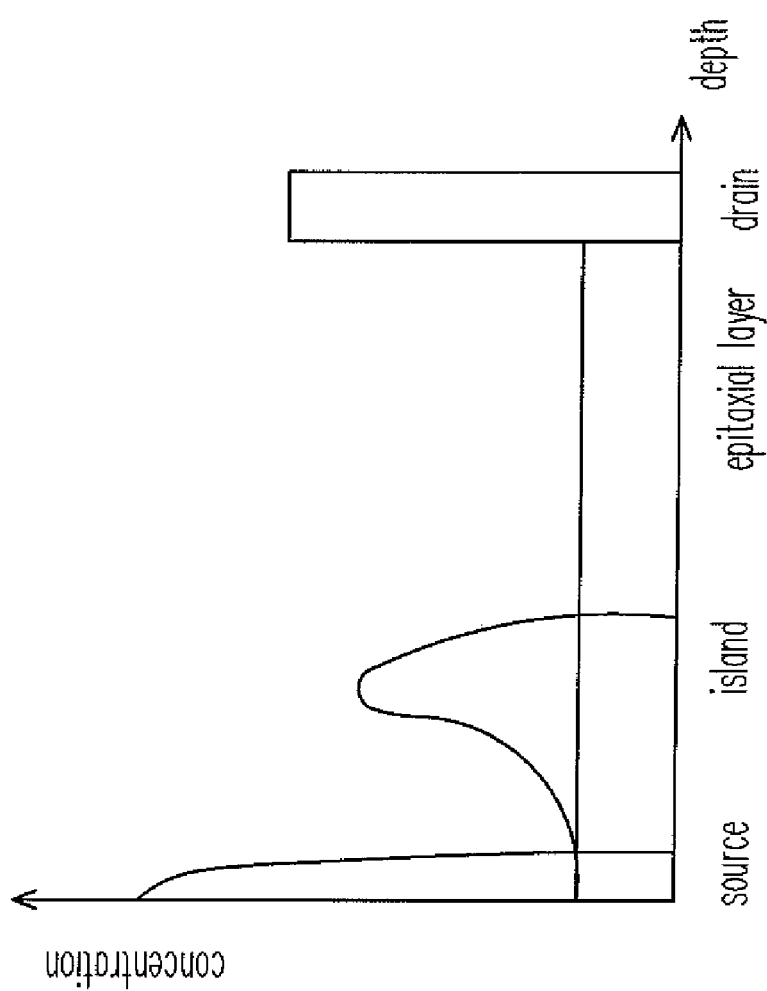
FIG. 5 is a graph showing distribution of doping concentration in a MOS device according to one preferred embodiment of the present invention.

The FIG. 5 shows distribution of doping concentration in a MOS device according to one preferred embodiment of the present invention. The vertical coordinate axis indicates concentration and the horizontal coordinate axis indicates depth. The doping concentration in the islands decreases gradually from the drain to the source, while the highest concentration is located near the drain. Hence, during the operation of the devices, the depletion width formed in the direction from the drain towards the source is diminished. Thus, the channel length of the device can be shortened. In other words, the trench can be formed shallowly so as to reduce the resistance of the channel and the capacitance of the gate.

Further, because the highest doping concentration in the islands is no longer near the source, the doping concentration depends on the dosage of the ion implantation or the amount of dopants during the formation of the epitaxial layer, and thus the threshold voltage of the device will not affect the doping concentration near the source and the drain. In other words, the present invention provides a way to lower the doping concentration near the islands so as to lower the threshold voltage of the devices and enhance the mobility of the carrier.

Moreover, when a high voltage is applied on the drain, a depletion region will be formed gradually in the direction from the drain towards the source, and once the depletion region pass over the highest point of doping concentration in the islands, the threshold voltage of the device will start to drop. Thus, the driving current can be increased and thus the durability of the device will be improved.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A method of fabricating a metal oxide semiconductor device, comprising the steps of:
   providing a substrate, wherein the substrate is doped a second conductivity type dopant and is used as a drain;
   forming a first conductivity type epitaxial layer on the substrate;
   forming a second conductivity type epitaxial layer on the first epitaxial layer, wherein the doping concentration in the second conductivity type epitaxial layer decreases gradually from the bottom to the top of the second conductivity type epitaxial layer;
   patterning the second conductivity type epitaxial layer and a portion of the first epitaxial layer with a pattern of trench to form a plurality of islands;
   forming a gate dielectric layer on a surface of the trench;
   forming a gate in the trench to cover the gate dielectric layer; and
   forming a source at the top of the islands.

2. The method of claim as in claim 1, wherein a depth of the trench is between 0.7 and 1.8 μm.

3. The method of claim as in claim 1, wherein doping concentration in the first conductivity type epitaxial layer is lower than doping concentration in the source and in the drain.

4. The method of claim as in claim 1, wherein upper surface of the gate is lower than upper surfaces of the islands.

5. The method of claim as in claim 1, after the step of forming the source, further comprising the steps of:
   forming a dielectric layer over the conductivity type first epitaxial layer, wherein the dielectric layer has an opening to expose a portion of the source;
   forming a second conductivity type doping region in the exposed region in the opening; and
   forming an interconnect metal on the dielectric layer and in the opening.

* * * * *